United States Patent
Wu et al.

(10) Patent No.: US 8,600,687 B2
(45) Date of Patent: Dec. 3, 2013

(54) SIGNAL ANALYZER FOR ANALYZING DYNAMIC BEHAVIOR OF A TARGET SYSTEM

(75) Inventors: Rong-Ching Wu, Dashu Township (TW); Ching-Tai Chiang, Dashu Township (TW); Jong-Ian Tsai, Dashu Township (TW)

(73) Assignee: I Shou University, Dashu Township (TW)

( * ) Notice: Subject to any disclaimer, the term of this patent is extended or adjusted under 35 U.S.C. 154(b) by 972 days.

(21) Appl. No.: 12/625,953

(22) Filed: Nov. 25, 2009

(65) Prior Publication Data
US 2011/0125438 A1    May 26, 2011

(51) Int. Cl.
*G01R 25/00* (2006.01)
(52) U.S. Cl.
USPC .......................................................... 702/65
(58) Field of Classification Search
USPC .................................................... 702/65–75
See application file for complete search history.

(56) References Cited

U.S. PATENT DOCUMENTS

2004/0085096 A1* 5/2004 Ward et al. ........................ 327/2

* cited by examiner

*Primary Examiner* — Stephen Cherry
(74) *Attorney, Agent, or Firm* — Alan Kamrath; Kamrath IP Lawfirm, P.A.

(57) ABSTRACT

A signal analyzer includes a sampling unit, a filter unit coupled to the sampling unit, a computing unit coupled to the filter unit, and an output unit coupled to the computing unit. The sampling unit is operable to sample a time domain signal from a target system according to a predetermined sampling frequency to obtain a sampling signal. The filter unit is configured to perform filter processing upon the sampling signal so as to filter out harmonic frequency components from the sampling signal, thereby obtaining a fundamental frequency signal having a plurality of sample points. The computing unit is operable to compute a signal parameter set for each of temporally adjacent pairs of the sample points of the fundamental frequency signal. The output unit is configured to output information about dynamic behavior of the target system based upon the signal parameter sets computed by the computing unit.

25 Claims, 3 Drawing Sheets

US 8,600,687 B2

SIGNAL ANALYZER FOR ANALYZING DYNAMIC BEHAVIOR OF A TARGET SYSTEM

BACKGROUND OF THE INVENTION

1. Field of the Invention

The present invention relates to a signal analyzer, more particularly to a signal analyzer for analyzing dynamic behavior of a target system.

2. Description of the Related Art

Signal analysis is widely used in electrical power equipment, communication, energy management, and system stability. By signal analysis, a system model of a target system can be established for analyzing steady, transient and dynamic behavior of the target system.

Currently, signal analysis is generally divided into time-domain and frequency-domain methods. Regarding the frequency-domain methods, a group power method based upon Parserval's theorem is used to calculate a dynamic signal (C. S. Moo, Y. N. Chang, and P. P. Mok, "A Digital Measurement Scheme for Time-varying Transient Harmonics," *IEEE Trans. Power Delivery*, vol. 10, No. 2, April 1995, pages 588-594). The group power method can conveniently and quickly find amplitudes of harmonics. Furthermore, an interpolated Fast Fourier Transform method uses band parameters to analyze accurate harmonic parameters that include frequency, amplitude and phase parameters of harmonics (V. K. Jain, W. L. Collins, Jr., and D. C. Davis, "High-accuracy Analog Measurements via Interpolated FFT," *IEEE Trans. Instrument Measurements*, vol. IM-28, No. 2, June 1979, pages 113-122). However, all the frequency-domain methods need sufficient data. Therefore, ability of the frequency-domain methods for analyzing the dynamic signal will be limited.

Relatively, the time-domain methods only need few data to calculate signal parameters. Therefore, the time-domain methods are suitable for analyzing dynamic signals. For example, the Gauss method has a succinct structure to analyze signal parameters, and an optimization method uses least mean square to restrain disturbance from noise (H. C. So and Y. T. Chan, "Analysis of an LMS Algorithm for Unbiased Impulse Response Estimation," *IEEE Trans. Signal Processing*, vol. 51, pages 2008-2013, July 2003). In practice, the disturbance exists in a time-domain signal, and the disturbance may significantly affect analyzing result. For reducing the disturbance, an amount of the data used in the time-domain methods is required to be increased. However, ability of real-time operation will weaken when the required amount of the data is increased. Therefore, it is hard to achieve accuracy and real-time operation in signal analysis at the same time.

SUMMARY OF THE INVENTION

Therefore, an object of the present invention is to provide a signal analyzer for analyzing dynamic behavior of a target system.

Accordingly, a signal analyzer of the present invention comprises a sampling unit, a filter unit coupled to the sampling unit, a computing unit coupled to the filter unit, and an output unit coupled to the computing unit.

The sampling unit is operable to sample a time domain signal from a target system according to a predetermined sampling frequency to obtain a sampling signal. The filter unit is configured to perform filter processing upon the sampling signal outputted by the sampling unit so as to filter out harmonic frequency components from the sampling signal, thereby obtaining a fundamental frequency signal having a plurality of sample points. The computing unit is operable to compute a signal parameter set for each of temporally adjacent pairs of the sample points of the fundamental frequency signal. The output unit is configured to output information about dynamic behavior of the target system based upon the signal parameter sets computed by the computing unit.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
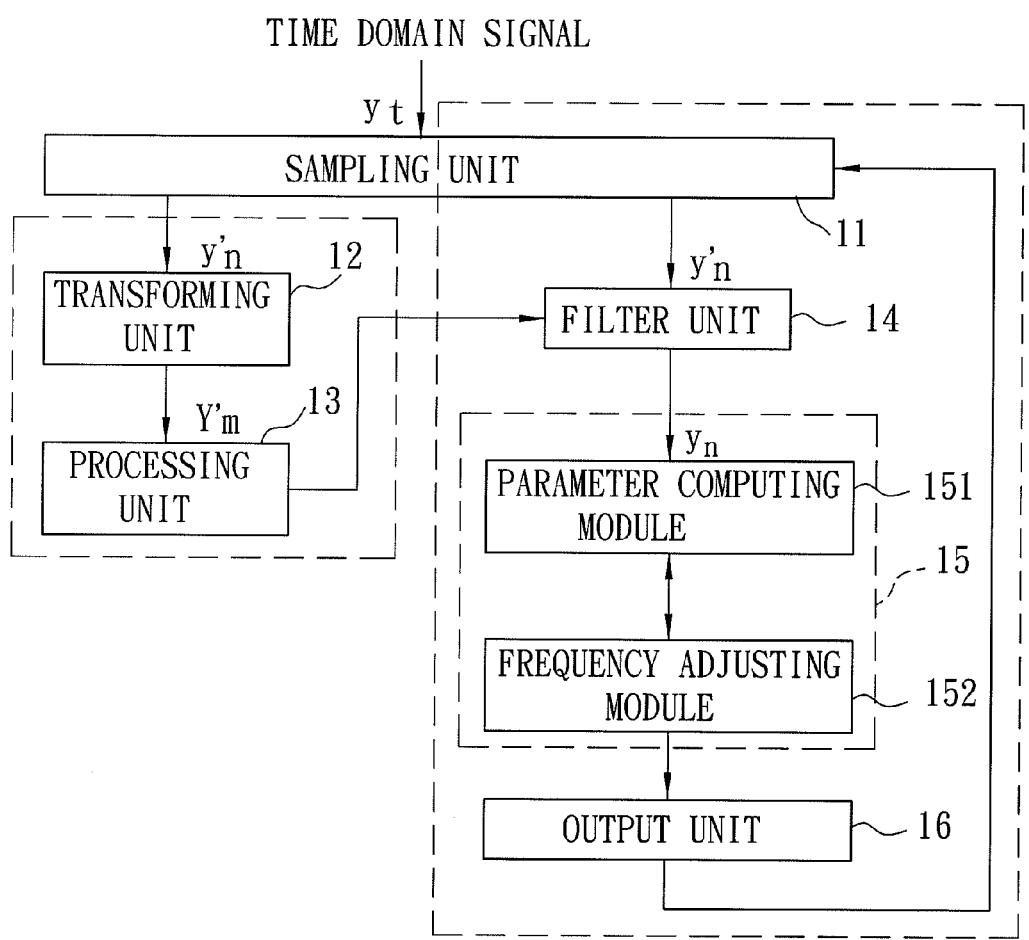
FIG. 1 is a schematic block diagram of a preferred embodiment of a signal analyzer according to the present invention.

Referring to FIG. 1, the preferred embodiment of a signal analyzer for analyzing dynamic behavior of a target system according to the present invention includes a sampling unit 11, a transforming unit 12, a processing unit 13, a filter unit 14, a computing unit 15, and an output unit 16. In this embodiment, the computing unit 15 is configured with a parameter computing module 151 and a frequency adjusting module 152. The output unit 16 is, but not limited to, a monitor, a printing device, or other display devices.

Figure 2:
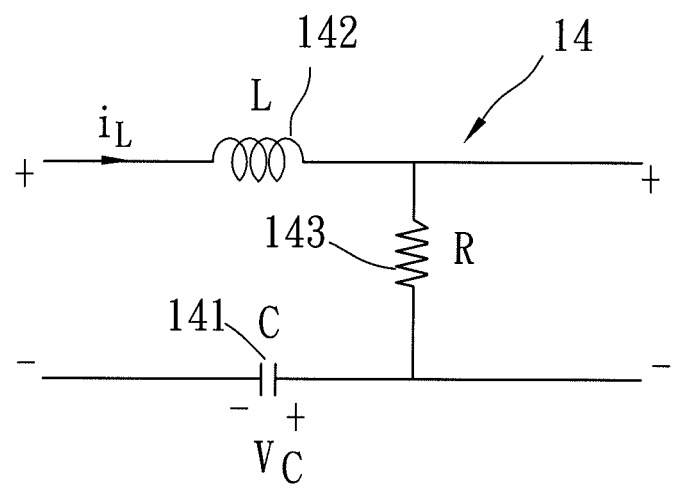
FIG. 2 is a circuit diagram illustrating an equivalent circuit of a filter unit of the signal analyzer of the preferred embodiment.

The sampling unit 11 is operable to sample a time domain signal ($y_t$) from a target system according to a predetermined sampling frequency (1/T) to obtain a sampling signal ($y'_n$). The filter unit 14 is configured to perform filter processing upon the sampling signal ($y'_n$) outputted by the sampling unit 11 so as to filter out noise and harmonic frequency components from the sampling signal ($y'_n$), thereby obtaining a fundamental frequency signal ($y_n$) having a plurality of sample points. In this embodiment, the filter unit 14 is a second order filter and has an equivalent circuit in a form of a series RLC circuit as shown in FIG. 2. In particular, the filter unit 14 is configured with a capacitive component 141, an inductive component 142, and a resistive component 143. The capacitive component 141 having a voltage value $v_C$ and the inductive component 142 having a current value $i_L$ serve as energy storage components. The filter unit 14 performs the filter processing according to an initial current value $i_{L,0}$ of the inductive component 142, an initial voltage value $v_{C,0}$ of the capacitive component 141, and a filter parameter set.

It should be noted that, when the signal analyzer is used to analyze the time domain signal ($y_t$) from a different target system, the initial current value $i_{L,0}$, the initial voltage value $v_{C,0}$ and the filter parameter set of the filter unit 14 should be appropriately initialized according to signal parameters of the time domain signal ($y_t$) so as to effectively filter out noise and harmonic frequency components from the sampling signal ($y'_n$). The following description is provided to describe initialization of the filter unit 14 in detail.

Referring to FIGS. 1 and 2, the transforming unit 12 is coupled to the sampling unit 11, and is operable to transform the sampling signal ($y'_n$) to a frequency domain signal ($Y'_m$)

by Fast Fourier Transform (FFT). The processing unit 13 is coupled between the transforming unit 12 and the filter unit 14, and is operable to obtain an initial fundamental frequency parameter ($f_0$) and a bandwidth parameter (BW) according to the frequency domain signal ($Y'_m$) that is associated with the sampling signal ($y'_n$). In detail, the processing unit 13 determines the initial fundamental frequency parameter ($f_0$) associated with a frequency with the greatest amplitude $|Y'_f|$ in a frequency spectrum of the frequency domain signal ($Y'_m$), and then determines the bandwidth parameter (BW) according to frequency distribution of the frequency domain signal ($Y'_m$). Particularly, the processing unit 13 determines the bandwidth parameter (BW) by computing a difference between the greatest and lowest frequencies associated with amplitudes of frequency components of the frequency domain signal ($Y'_m$) that are greater than a predetermined threshold value. Generally, the frequency distribution is between 30 Hz and 90 Hz, and thus the bandwidth parameter (BW) can be set as 60 Hz.

Subsequently, the processing unit 13 further determines the filter parameter set based upon the initial fundamental frequency parameter ($f_0$) and the bandwidth parameter (BW). The filter parameter set includes a capacitance parameter (C) corresponding to the capacitive component 141, an inductance parameter (L) corresponding to the inductive component 142, and a resistance parameter (R) corresponding to the resistive component 143. In this embodiment, a resonance frequency of the filter unit 14 may be set as the initial fundamental frequency parameter ($f_0$), and frequency components near the fundamental frequency parameter will be retained. The capacitance parameter (C) and the inductance parameter (L) can be determined based upon the following equation, $$L = C = \frac{1}{2\pi f_0}. \tag{1}$$

Further, the resistance parameter (R) can be determined based upon the following equation, $$R = L \times BW. \tag{2}$$

Then, the initial current value $i_{L,0}$ and the initial voltage value $v_{C,0}$ can be determined based upon the following equations, $$i_{L,0} = \frac{2|Y'_f|}{R}\sin(\angle Y'_f), \text{ and} \tag{3}$$

$$v_{c,0} = \frac{-2|Y'_f|}{R}\cos(\angle Y'_f), \tag{4}$$

wherein $\angle Y'_f$ is a phase of the fundamental frequency component in the frequency spectrum.

It should be noted that, the energy storage components, i.e., the capacitive component 141 and the inductive component 142, of the filter unit 14 of this embodiment may have transient response when the filter unit 14 starts to operate. The transient response of the storage components will affect performance of the filter unit 14. However, the above-mentioned initialization of the filter unit 14 can effectively decrease the transient response of the energy storage components.

Figure 3:
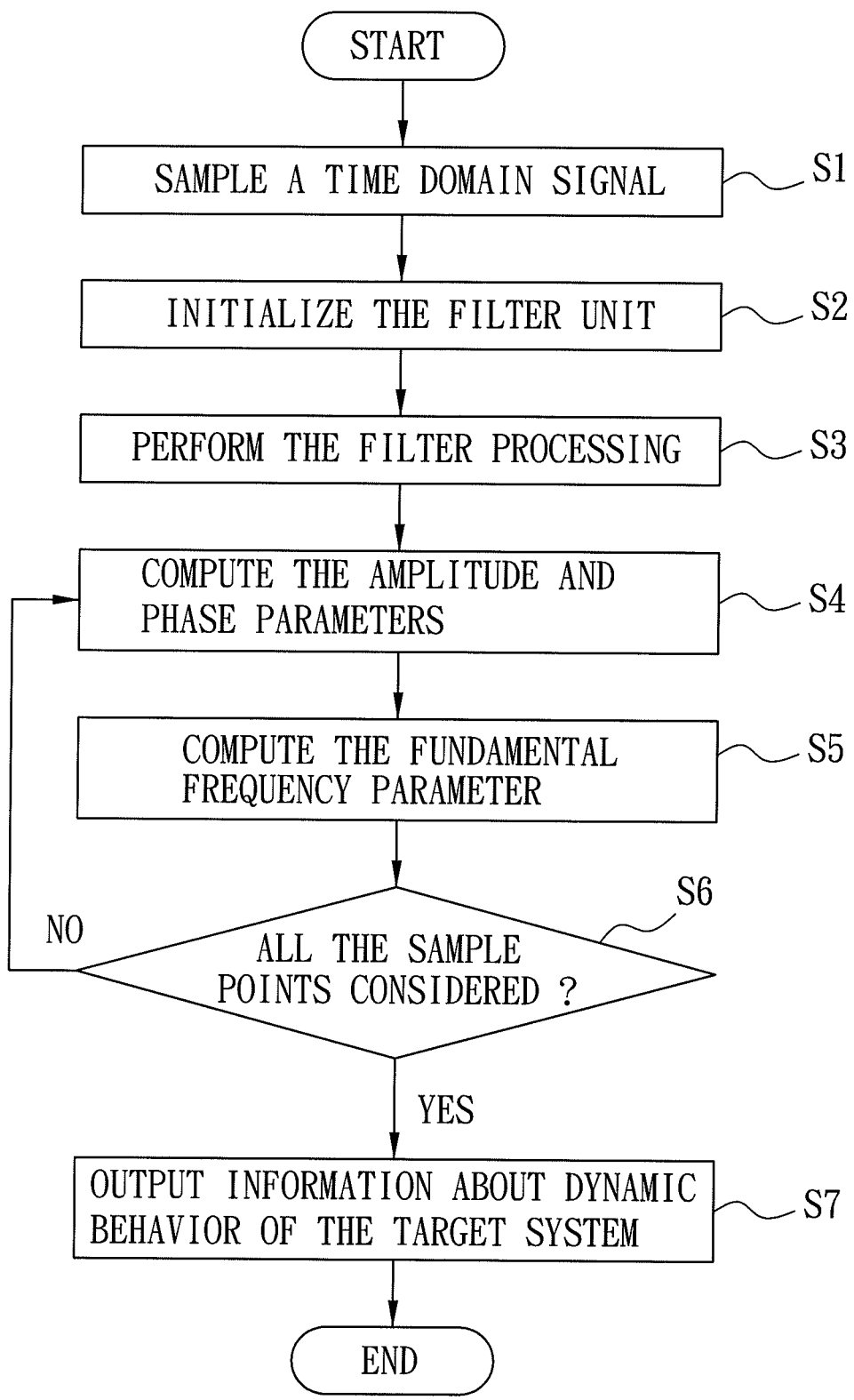
FIG. 3 is a flow chart illustrating operation of the signal analyzer of the preferred embodiment for analyzing dynamic behavior of a target system.

Operation of the signal analyzer will be described in the following with reference to FIGS. 1 and 3. In step (S1), the sampling unit 11 samples the time domain signal ($y_t$) from the target system according to the predetermined sampling frequency (1/T) to obtain the sampling signal ($y'_n$). In step (S2), the transforming unit 12 and the processing unit 13 cooperate to initialize the initial current value $i_{L,0}$, the initial voltage value $v_{C,0}$, and the filter parameter set of the filter unit 14 in the manner described above. Then, in step (S3), the filter unit 14 performs the filter processing to obtain the fundamental frequency signal ($y_n$) according to the initial voltage value $v_{C,0}$, and the filter parameter set determined in step (S2).

Subsequently, the computing unit 15 is operable to compute a signal parameter set for each of temporally adjacent pairs of the sample points of the fundamental frequency signal ($y_n$) in steps (S4) and (S5). Each of the signal parameter sets includes an amplitude parameter ($A_n$), a phase parameter ($\phi_n$), and a fundamental frequency parameter ($f_n$). The fundamental frequency signal ($y_n$) can be expressed as a sinusoidal form, $$y_n = A_n \sin(2\pi f_n nT + \phi_n), n = 0,1,2 \tag{5}$$

For each of temporally adjacent pairs of the sample points of the fundamental frequency signal ($y_n$), according to Equation (5), the two sample points can be expressed as $$y_n = A_n \sin(2\pi f_{n-1} nT + \phi_n), \text{ and} \tag{6}$$

$$y_{n-1} = A_n \sin(2\pi f_{n-1}(n-1)T + \phi_n) \tag{7}$$

In step (S4), the parameter computing module 151 of the computing unit 15 is operable to solve the Equations (6) and (7) to obtain the amplitude parameter ($A_n$) and the phase parameter ($\phi_n$) of each of the signal parameter sets. It should be noted that, the fundamental frequency parameter ($f_n$) of each of the signal parameter sets has an initial value (f) set to the initial fundamental frequency parameter ($f_0$) if the signal parameter set is a first one of the signal parameter sets (n=1), and to the fundamental frequency parameter ($f_{n-1}$) of an immediately preceding one of the signal parameter sets if otherwise (n>1). Particularly, the parameter computing module 151 computes the amplitude parameter ($A_n$) and the phase parameter ($\phi_n$) according to $$A_n = \frac{1}{\sin(2\pi f_{n-1}T)}\sqrt{y_n^2 + y_{n-1}^2 + 2y_n y_{n-1}\cos(2\pi fT)}, \tag{8}$$

and $$\phi_n = 2\pi f_{n-1}T - \sin^{-1}(y_n/A_n). \tag{9}$$

Although the fundamental frequency parameter ($f_n$) is related to the phase parameter ($\phi_n$), a frequency of an electrical equipment continuously varies when the electrical equipment operates in practice. Therefore, the fundamental frequency parameter ($f_n$) should be computed accurately. For improving stability of calculation of the signal parameter sets, in step (S5), the frequency adjusting module 152 of the computing unit 15 is operable to compute the fundamental frequency parameter ($f_n$) according to $$f_n = f_{n-1}(1 + \phi_n T) \tag{10}$$

Regarding the first one of the signal parameter sets (n=1), ($f_{n-1}$) is the initial fundamental frequency parameter ($f_0$). Otherwise (n>1), ($f_{n-1}$) is the fundamental frequency parameter ($f_1, f_2, f_3, \ldots$) of the immediately preceding one of the signal parameter sets. Then, the currently computed fundamental frequency parameter ($f_n$) is used in a next iteration for computing the amplitude parameter ($A_n$) and the phase parameter ($\phi_n$) of a next one of the signal parameter sets.

In step (S6), the computing unit 15 determines whether all the sample points have been considered for computing the signal parameter sets. The flow goes back to step (S4) if the determination made in step (S6) is negative, and goes to step (S7) if otherwise. Then, the output unit 16 is configured to output information about dynamic behavior of the target system based upon the signal parameter sets computed by the computing unit 15 in step (S7).

Additionally, the present invention can be embodied in a computer program product having a machine readable storage medium that includes program instructions for configuring a computer to perform consecutive steps of a method for analyzing dynamic behavior of the target system according to the above-mentioned steps (S1) to (S7). For example, each of the transforming unit 12, the processing unit 13, the filter unit 14, and the computing unit 15 can be in a form of program instructions with related functionalities. A hardware device, such as an electrical power analyzer, can be configured to perform the method for analyzing dynamic behavior of the target system by the program instructions, and the output unit 16, such as a display of the electrical power analyzer, is configured to output the information of the dynamic behavior of the target system.

In sum, with the suitable initial values ($v_{C,0}$, $i_{L,0}$) and filter parameter set (R, L, C), the filter unit 14 can effectively filter out harmonic frequency components from the sampling signal ($y'_n$) in which features of the time domain signal ($y_t$) remain. The signal analyzer of the present invention can accurately compute one of the signal parameter sets with only two sample points. Therefore, the present invention can achieve accuracy and real-time operation in signal analysis at the same time.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A signal analyzer comprising:
   a sampling unit operable to sample a time domain signal from a target system according to a predetermined sampling frequency to obtain a sampling signal;
   a filter unit coupled to said sampling unit and configured with at least one energy storage component having an initial value to perform filter processing according to the initial value of said at least one energy component and a filter parameter set that is determined based upon an initial fundamental frequency parameter and a bandwidth parameter, which are associated with the sampling signal outputted by said sampling unit, so as to filter out harmonic frequency components from the sampling signal, thereby obtaining a fundamental frequency signal having a plurality of sample points;
   a computing unit coupled to said filter unit and operable to compute a signal parameter set for each of temporally adjacent pairs of the sample points of the fundamental frequency signal; and
   an output unit coupled to said computing unit and configured to output information about dynamic behavior of the target system based upon the signal parameter sets computed by said computing unit.

2. The signal analyzer as claimed in claim 1, further comprising a transforming unit coupled to said sampling unit and operable to transform the sampling signal to a frequency domain signal, and a processing unit coupled between said transforming unit and said filter unit and operable to obtain the initial fundamental frequency parameter and the bandwidth parameter according to the frequency domain signal that is associated with the sampling signal, said processing unit further determining the filter parameter set based upon the initial fundamental frequency parameter and the bandwidth parameter.

3. The signal analyzer as claimed in claim 2, wherein said processing unit further determines the initial value of said at least one energy storage component of said filter unit based on the filter parameter set and an input vector associated with the sampling signal.

4. The signal analyzer as claimed in claim 1, wherein the filter parameter set includes an inductance parameter, a capacitance parameter, and a resistance parameter.

5. The signal analyzer as claimed in claim 4, wherein the inductance parameter (L) and the capacitance parameter (C) are determined according to $$L = C = \frac{1}{2\pi f_0},$$

where $f_0$ is the initial fundamental frequency parameter.

6. The signal analyzer as claimed in claim 4, wherein the resistance parameter (R) is determined according to $$R = L \times BW,$$

where BW is the bandwidth parameter and L is the inductance parameter.

7. The signal analyzer as claimed in claim 1, wherein said filter unit is configured with an inductive component and a capacitive component that serve as said energy storage components, the initial value of said inductive component being an initial current value, the initial value of said capacitive component being an initial voltage value.

8. The signal analyzer as claimed in claim 1, wherein said filter unit is a second order filter.

9. The signal analyzer as claimed in claim 1, wherein said filter unit has an equivalent circuit in a form of a series RLC circuit.

10. The signal analyzer as claimed in claim 1, wherein each of the signal parameter sets computed by said computing unit includes an amplitude parameter, a phase parameter and a fundamental frequency parameter.

11. The signal analyzer as claimed in claim 10, wherein said computing unit computes the amplitude parameter and the phase parameter of each of the signal parameter sets according to the fundamental frequency parameter of each of the signal parameter sets that has an initial value set to the initial fundamental frequency parameter if the signal parameter set is a first one of the signal parameter sets and to the fundamental frequency parameter of an immediately preceding one of the signal parameter sets if otherwise.

12. The signal analyzer as claimed in claim 1, wherein each of the signal parameter sets computed by said computing unit includes an amplitude parameter, a phase parameter and a fundamental frequency parameter, and said computing unit is configured with
   a parameter computing module operable to compute the amplitude parameter and the phase parameter of each of the signal parameter sets according to a corresponding one of the temporally adjacent pairs of the sample points of the fundamental frequency signal; and
   a frequency adjusting module coupled to said parameter computing module, and operable to compute the fundamental frequency parameter based upon the phase parameter.

13. The signal analyzer as claimed in claim 12, wherein, for each of the signal parameter sets, the sample points in the corresponding one of the temporally adjacent pairs of the sample points are expressed as a pair of sinusoidal equations, and said parameter computing module is operable to solve the sinusoidal equations according to the fundamental frequency parameter of each of the signal parameter sets that has an initial value set to the initial fundamental frequency parameter if the signal parameter set is a first one of the signal parameter sets and to the fundamental frequency parameter of an immediately preceding one of the signal parameter sets if otherwise, to obtain the amplitude parameter and the phase parameter.

14. The signal analyzer as claimed in claim 12, wherein, for each of the signal parameter sets, said parameter computing module is operable to compute the amplitude parameter based upon the predetermined sampling frequency, an initial value of the fundamental frequency parameter, and the sample points in the corresponding one of the temporally adjacent pairs of the sample points, wherein the initial value of the fundamental frequency parameter used by said parameter computing module in computing the amplitude parameter is the initial fundamental frequency parameter if the signal parameter set is a first one of the signal parameter sets, and is the fundamental frequency parameter of an immediately preceding one of the signal parameter sets if otherwise.

15. The signal analyzer as claimed in claim 14, wherein, for each of the signal parameter sets, said parameter computing module is operable to compute the phase parameter based upon the predetermined sampling frequency, the initial value of the fundamental frequency parameter, the amplitude parameter, and a latter one of the sample points in the corresponding one of the temporally adjacent pairs of the sample points.

16. The signal analyzer as claimed in claim 12, wherein, for each of the signal parameter sets, said frequency adjusting module is operable to compute the fundamental frequency parameter based upon the predetermined sampling frequency, an initial value of the fundamental frequency parameter, and the phase parameter, wherein the initial value of the fundamental frequency parameter used by said frequency adjusting module in computing the fundamental frequency parameter is the initial fundamental frequency parameter if the signal parameter set is a first one of the signal parameter sets, and is the fundamental frequency parameter of an immediately preceding one of the signal parameter sets if otherwise.

17. A non-transitory machine readable storage medium comprising program instructions for configuring a computer to perform consecutive steps of a method for analyzing dynamic behavior of a target system, said method comprising:

a) sampling a time domain signal from the target system according to a predetermined sampling frequency to obtain a sampling signal;

b) performing filter processing according to an initial value of at least one energy component and a filter parameter set that is determined based upon an initial fundamental frequency parameter and a bandwidth parameter which are associated with the sampling signal obtained in step a) so as to filter out harmonic frequency components from the sampling signal, thereby obtaining a fundamental frequency signal having a plurality of sample points;

c) computing a signal parameter set for each of temporally adjacent pairs of the sample points of the fundamental frequency signal obtained in step b); and d) outputting information about the dynamic behavior of the target system based upon the signal parameter sets computed in step c).

18. The non-transitory machine readable storage medium as claimed in claim 17, wherein said method further comprises:

e) transforming the sampling signal to a frequency domain signal; and f) obtaining the initial fundamental frequency parameter and the bandwidth parameter according to the frequency domain signal that is associated with the sampling signal.

19. The non-transitory machine readable storage medium as claimed in claim 17, wherein each of the signal parameter sets computed in step c) includes an amplitude parameter, a phase parameter and a fundamental frequency parameter.

20. The non-transitory machine readable storage medium as claimed in claim 19, wherein, in step c), the amplitude parameter and the phase parameter of each of the signal parameter sets are computed according to the fundamental frequency parameter of each of the signal parameter sets that has an initial value set to the initial fundamental frequency parameter if the signal parameter set is a first one of the signal parameter sets and to the fundamental frequency parameter of an immediately preceding one of the signal parameter sets if otherwise.

21. The non-transitory machine readable storage medium as claimed in claim 17, wherein each of the signal parameter sets computed in step c) includes an amplitude parameter, a phase parameter and a fundamental frequency parameter, and step c) includes c1) computing the amplitude parameter and the phase parameter of each of the signal parameter sets according to a corresponding one of the temporally adjacent pairs of the sample points of the fundamental frequency signal; and c2) computing the fundamental frequency parameter based upon the phase parameter.

22. The non-transitory machine readable storage medium as claimed in claim 21, wherein, for each of the signal parameter sets, the sample points in the corresponding one of the temporally adjacent pairs of the sample points are expressed as a pair of sinusoidal equations, and in sub-step c1), the sinusoidal equations are solved according to the fundamental frequency parameter of each of the signal parameter sets that has an initial value set to the initial fundamental frequency parameter if the signal parameter set is a first one of the signal parameter sets and to the fundamental frequency parameter of an immediately preceding one of the signal parameter sets if otherwise, to obtain the amplitude parameter and the phase parameter.

23. The non-transitory machine readable storage medium as claimed in claim 21, wherein, in sub-step c1), for each of the signal parameter sets, the amplitude parameter is computed based upon the predetermined sampling frequency, an initial value of the fundamental frequency parameter, and the sample points in the corresponding one of the temporally adjacent pairs of the sample points, wherein the initial value of the fundamental frequency parameter used in sub-step c1) in computing the amplitude parameter is the initial fundamental frequency parameter if the signal parameter set is a first one of the signal parameter sets, and is the fundamental frequency parameter of an immediately preceding one of the signal parameter sets if otherwise.

24. The non-transitory machine readable storage medium as claimed in claim 23, wherein, in sub-step c1), for each of the signal parameter sets, the phase parameter is computed based upon the predetermined sampling frequency, the initial value of the fundamental frequency parameter, the amplitude parameter, and a latter one of the sample points in the corresponding one of the temporally adjacent pairs of the sample points.

25. The non-transitory machine readable storage medium as claimed in claim 21, wherein, in sub-step c2), for each of the signal parameter sets, the fundamental frequency parameter is computed based upon the predetermined sampling frequency, an initial value of the fundamental frequency parameter, and the phase parameter, and
  wherein the initial value of the fundamental frequency parameter used in sub-step c2) in computing the frequency parameter is the initial fundamental frequency parameter if the signal parameter set is a first one of the signal parameter sets, and is the fundamental frequency parameter of an immediately preceding one of the signal parameter sets if otherwise.

\* \* \* \* \*